(12) United States Patent
Leatherdale et al.

(10) Patent No.: US 8,455,903 B2
(45) Date of Patent: Jun. 4, 2013

(54) NON-RADIATIVELY PUMPED WAVELENGTH CONVERTER

(75) Inventors: Catherine A. Leatherdale, Woodbury, MN (US); Craig R. Schardt, Woodbury, MN (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 13/264,817

(22) PCT Filed: Apr. 19, 2010

(86) PCT No.: PCT/US2010/031585
§ 371 (c)(1),
(2), (4) Date: Oct. 17, 2011

(87) PCT Pub. No.: WO2010/123814
PCT Pub. Date: Oct. 28, 2010

(65) Prior Publication Data
US 2012/0032142 A1 Feb. 9, 2012

Related U.S. Application Data

(60) Provisional application No. 61/170,754, filed on Apr. 20, 2009.

(51) Int. Cl.
*H01L 33/00* (2010.01)
(52) U.S. Cl.
USPC ............... 257/98; 257/E33.061; 257/E33.067
(58) Field of Classification Search
CPC ............ H01L 33/20; H01L 33/60; H01L 33/62
USPC ...... 257/13, 98, E33.061, E33.067; 977/932, 977/950, 952
See application file for complete search history.

(56) References Cited

U.S. PATENT DOCUMENTS

2003/0160259 A1 8/2003 Uemura
2003/0219625 A1* 11/2003 Wolk et al. .................... 428/690
(Continued)

FOREIGN PATENT DOCUMENTS

EP 1 762 642 3/2007
EP 1 990 842 11/2008
(Continued)

OTHER PUBLICATIONS

Elfstrom et al., "Quantum dot nano-composites as colour-converters for micro-pixellated gallium nitride light-emitting diodes", 2008, IEEE Lasers and Electro-Optics Society, 2008. LEOS 2008. 21st Annual Meeting of the, pp. 505-506 , Nov. 2008.*

(Continued)

*Primary Examiner* — Nikolay Yushin
(74) *Attorney, Agent, or Firm* — Kristofor L. Storvick

(57) ABSTRACT

A light source comprises an electroluminescent device that generates pump light and a wavelength converter that includes an absorbing element for absorbing at least some of the pump light. A first layer of light emitting elements is positioned proximate the absorbing element for non-radiative transfer of energy from the absorbing element to the light emitting elements. At least some of the light emitting elements are capable of emitting light having a wavelength longer than the wavelength of the pump light. In some embodiments the electroluminescent device is a light emitting diode (LED) that has a doped semiconductor layer positioned between the LED's active layer and the light emitting elements. The first doped semiconductor layer may have a thickness in excess of 20 nm. A second layer of light emitting elements may be positioned for non-radiative energy transfer from the first layer of light emitting elements.

4 Claims, 4 Drawing Sheets

U.S. PATENT DOCUMENTS

| | | | |
|---|---|---|---|
| 2004/0061124 A1* | 4/2004 | Trottier et al. | 257/103 |
| 2005/0253152 A1 | 11/2005 | Klimov | |
| 2006/0071225 A1* | 4/2006 | Beeson et al. | 257/98 |
| 2006/0091789 A1 | 5/2006 | Aoyama | |
| 2006/0124917 A1 | 6/2006 | Miller | |
| 2006/0145137 A1 | 7/2006 | Wang | |
| 2007/0085100 A1 | 4/2007 | Diana | |
| 2008/0121818 A1 | 5/2008 | Agrawal | |
| 2008/0217639 A1 | 9/2008 | Kim | |
| 2009/0194774 A1* | 8/2009 | Huang et al. | 257/88 |
| 2010/0224857 A1* | 9/2010 | Soh et al. | 257/13 |
| 2011/0156616 A1 | 6/2011 | Anderson | |

FOREIGN PATENT DOCUMENTS

| | | | |
|---|---|---|---|
| JP | 2001-237461 | | 8/2001 |
| WO | WO 2007/095173 | | 8/2007 |
| WO | WO 2007/146861 | | 12/2007 |
| WO | WO 2009/039815 | | 4/2009 |
| WO | WO2009/047425 | * | 4/2009 |
| WO | WO 2010/028146 | | 3/2010 |
| WO | WO 2010/123809 | | 10/2010 |

OTHER PUBLICATIONS

Achermann et al., "'Noncontact' pumping of semiconductor nanocrystals via nonradiative energy transfer from a proximal quantum well", 2 pages, © 2000 Optical Society of America.

Achermann et al., "Picosecond Energy Transfer in Quantum Dot Langmuir-Blodgett Nanoassemblies", Journal of Physical Chemistry B, pp. 13782-13787, © 2003 American Chemical Society, Published on Web Nov. 20, 2003.

Achermann et al., "Nanocrystal-Based Light-Emitting Diodes Utilizing High-Efficiency Nonradiative Energy Transfer for Color Conversion." Nanoletters 2006, vol. 6, No. 7, pp. 1396-1400, © 2006 American Chemical Society.

Belton et al., "New light from hybrid inorganic-organic emitters," Journal of Physics D: Applied Physics, 41, 0940006, 12 pages, © 2008 IOP Publishing.

Crooker et al., "Spectrally Resolved Dynamics of Energy Transfer in Quantum-Dot Assemblies: Towards Engineered Energy Flows in Artificial Materials", Physical Review Letters, pp. 186802-1-186802-4, vol. 89, No. 18, Oct. 28, 2002.

Gong et al., "Efficient flip-chip InGaN micro-pixellated light-emitting diode arrays: promising candidates for micro-displays and colour conversion", Journal of Physics D: Applied Physics, vol. 41, 6 pages, © 2008 IOP Publishing Ltd.

Kang, Myung-Gyu and Guo, Jay L., "Nanoimprinted Semitransparent Metal Electrodes and Their Application in Organic Light-Emitting Diodes," Advanced Materials 2007, vol. 19, pp. 1391-1396, © 2007 Wiley-VCH Verlag GmbH & Co. KGaA, Weinheim.

Lambert et al., "Quantum Dot Micropatterning on Si", Langmuir 2008, pp. 5961-5966, © 2008 American Chemical Society, Published on Web Apr. 29, 2008.

Miyake et al. "Fabrication and Evaluation of Three-Dimensional Optically Coupled Common Memory", Japanese Journal of Applied Physics, vol. 34, No. 2B, pp. 1246-1248, Feb. 1995.

Search Report for International Application No. PCT/US2010/031585, 5 pages, Date of Mailing Sep. 7, 2010.

Written Opinion for International Application No. PCT/US2010/031585, 9 pages, Date of Mailing Sep. 7, 2010.

Janotti et al., *Fundamentals of Zinc Oxide as a Semiconductor*, 2009 Rep. Prog. Phys., vol. 72, 126501, pp. 1-29, Jul. 2009.

Tsukazaki et al., Blue Light-Emitting Diodes Based on ZnO, 2005, *Japanese Journal of Applied Physics*, vol. 44, No. 21, pp. L643-L645, May 2005.

Xu et al., *Application of Blue-Green and Ultraviolet Micro-LED to Biological Imaging and Detection*, 2008, Journal of Physics D: Applied Physics, 41,094013, pp. 1-13, May 2008.

\* cited by examiner

NON-RADIATIVELY PUMPED WAVELENGTH CONVERTER

CROSS REFERENCE TO RELATED APPLICATIONS

This application is a national stage filing under 35 U.S.C. 371 of PCT/US2010/031585, filed on Apr. 19, 2010, which claims priority to U.S. Provisional Application No. 61/170,754, filed on Apr. 20, 2009, the disclosure of which is incorporated by reference in its/their entirety herein.

FIELD OF THE INVENTION

The invention relates to light sources, and more particularly to a solid state device that converts light at an input wavelength to at least one longer wavelength. The invention is particularly suitable for converting the wavelength of solid state light sources such as light emitting diodes and lasers, but can also be used with outer types of light sources.

BACKGROUND

Illumination systems are used in many different applications, including projection display systems, backlights for liquid crystal displays and the like. Projection systems often use one or more white light sources, such as high pressure mercury lamps. The white light beam is usually split into three primary colors, red, green and blue, and is directed to respective image forming spatial light modulators to produce an image for each primary color. The resulting primary-color image beams are combined and projected onto a projection screen for viewing.

More recently, light emitting diodes (LEDs) have been considered as an alternative to white light sources. LEDs have the potential to provide the brightness and operational lifetime that would compete with conventional light sources. Current LEDs, however, especially green emitting LEDs, are relatively inefficient.

Conventional light sources are generally bulky, inefficient in emitting one or more primary colors, difficult to integrate, and tend to result in increased size and power consumption in optical systems that employ them.

Wavelength converted light emitting diodes (LEDs) are becoming increasingly important for illumination applications where there is a need for light of a color that is not normally generated by an LED, or where a single LED may be used in the production of light having a spectrum normally produced by a number of different LEDs together. One example of such an application is in the back-illumination of displays, such as liquid crystal display (LCD) computer monitors and televisions. In such applications there is a need for substantially white light to illuminate the LCD panel. One approach to generating white light with a single LED is to first generate blue light with the LED and then to convert some or all of the light to a different color. For example, where a blue-emitting LED is used as a source of white light, a portion of the blue light may be converted using a wavelength converter to yellow light. The resulting light, a combination of yellow and blue, appears white to the viewer. The color (white point) of the resulting light, however, may not be optimum for use in display devices, since the white light is the result of mixing only two different colors.

LEDs are also being used in image display systems, for example in television screens. In such applications an arrangement of individually addressable LEDs emitting red, green and blue light is used to illuminate one pixel. The relative luminance of each LED can be controlled so as to control the overall color perceived from the pixel.

In the newly-developing field of microprojection, a single LED imager device has been disclosed that includes individually addressable areas, pixels, that produce different colors, for example red, green and blue. The image is formed on the device by selectively illuminating the various pixels and projecting the image of the imager device.

There remains, however, a need to provide inexpensive, robust and efficient LED arrays capable of covering a large area with differently colored pixels.

SUMMARY OF THE INVENTION

One embodiment of the invention is directed to a light source that includes an electroluminescent device capable of generating pump light and an absorbing element capable of absorbing at least some of the pump light. Light emitting elements are positioned proximate the absorbing element for non-radiative transfer of energy from the absorbing element to the light emitting elements. At least some of the light emitting elements are capable of emitting light having a wavelength longer than the wavelength of the pump light.

Another embodiment of the invention is directed to light converter unit that includes a light absorbing element capable of absorbing light at a pump wavelength. The light absorbing element has an absorbing layer and a quantum well. A first arrangement of light emitting elements is disposed on a surface of the light absorbing element proximate the quantum well for non-radiative energy transfer from the quantum well to the light emitting elements. At least some of the light emitting elements are capable of emitting light at a first wavelength.

A light emitting diode device that includes a light emitting diode (LED) structure having an active semiconductor layer disposed between a first doped semiconductor layer and a second doped semiconductor layer. The active semiconductor layer is capable of emitting pump light at a first wavelength. A plurality of light emitting elements is arranged above the first doped semiconductor layer. The light emitting elements are capable of emitting light at a second wavelength longer than the first wavelength following non-radiative excitation; The first doped semiconductor layer has a thickness in excess of 20 nm.

Another embodiment of the invention is directed to a light source, that includes an electroluminescent device capable of generating pump light at a pump wavelength and an absorbing element capable of absorbing at least some of the pump light. A plurality of first nanoparticles is positioned proximate the absorbing element for non-radiative transfer of energy from the absorbing element to the first nanoparticles. A plurality of second nanoparticles is positioned proximate the first nanoparticles for non-radiative transfer of energy from the first nanoparticles to the second nanoparticles. At least some of the first nanoparticles having energy levels corresponding to a first wavelength longer than the pump wavelength and at least some of the second nanoparticles being capable of emitting light at a second wavelength longer than the first wavelength.

The above summary of the present invention is not intended to describe each illustrated embodiment or every implementation of the present invention. The following figures and detailed description more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
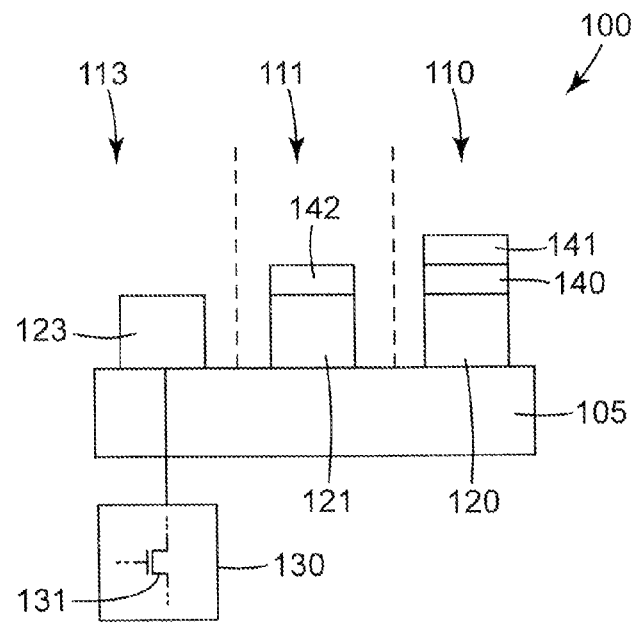
FIG. 1 schematically illustrates array of light emitting devices.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to light sources that incorporate a wavelength converter to convert the wavelength of at least a portion of the light originally emitted by the light source into at least one additional wavelength and, in some embodiments, two additional wavelengths or more. Herein, when light is said to be at a particular wavelength, it is to be understood that the light may have a range of wavelengths, with the particular wavelength being a peak wavelength within the range of wavelengths. For example, where it is stated that light has a wavelength of λ, it should be understood that the light may comprise a range of wavelengths having λ as the peak wavelength of the range of wavelengths. Additionally, if it is stated that the light is of a particular color, then it is to be understood that the light is perceived as that color even though it may contain components of a different color. For example, if it is stated that light is blue, the light is perceived as blue but may have a broad spectrum and may even include components that lie outside the blue region of the spectrum.

The light sources described herein can have larger or smaller light emitting regions where the output light of each region can be actively and independently controlled. The light sources can be used in, for example, a projection system to illuminate one or more image forming devices. Each light emitting region of the light source can illuminate a different portion or zone of the image forming device. Such a capability allows for efficient adaptive illumination systems where the output light intensity of a light emitting region of the light source can be actively adjusted to provide the minimum illumination required by a corresponding zone in the image forming device.

The disclosed light sources can form monochromatic (for example green or green on black) or color images. Such disclosed light sources combine the primary functions of light sources and image forming devices resulting in reduced size, power consumption, cost and the number of elements or components used in an optical system that incorporates the disclosed light sources. For example, in a display system, the disclosed light sources can function as both the light source and the image forming device, thereby eliminating or reducing the need for a backlight or a spatial modulator. As another example, incorporating the disclosed light sources in a projection system eliminates or reduces the need for image forming devices and relay optics.

Arrays of luminescent elements, such as arrays of pixels in a display system, are disclosed in which the luminescent elements include an electroluminescent device, such as a light emitting diode (LED), capable of emitting light in response to an electric signal. Some of the luminescent elements include one or more light converting elements, such as one or more potential wells and/or quantum wells, for down-converting light that is emitted by the electroluminescent devices. Down-conversion is a process that produces output light, or converted light, having a longer wavelength than the input, unconverted, light.

Arrays of luminescent elements disclosed in this application can be used in illumination systems, such as adaptive illumination systems for use in, for example, projection systems or other optical display systems.

FIG. 1 is a schematic side-view of a light emitting system 100 that includes an array of luminescent elements, such as luminescent elements 110, 111 and 113, where each element is capable of independently outputting light. Each luminescent element includes an electroluminescent device that is capable of emitting light in response to an electric signal. For example, luminescent elements 110, 111 and 113 include respective electroluminescent devices 120, 121 and 123 that may be disposed on a substrate 105.

In some cases, the luminescent elements are configured in an active matrix, meaning that at least some of the luminescent elements include respective dedicated switching circuits for driving the electroluminescent device(s) in those elements. In such cases, a luminescent element 113 may include a dedicated switching circuit 130 for driving electroluminescent device 123. The switching circuit 130 may include one or more transistors 131.

In some cases the luminescent elements may be configured as a passive matrix, meaning that the luminescent elements are not configured as an active matrix. In a passive matrix configuration, no luminescent element has a dedicated switching circuit for driving the electroluminescent device(s) in that element.

Typically, in a passive matrix configuration, the electroluminescent devices in the light emitting system are energized one row at a time. In contrast, in an active matrix configuration, although the rows are typically addressed one at a time, the switching circuits typically allow the electroluminescent devices to be energized individually. In some cases, at least some, and perhaps all, of the electroluminescent devices in light emitting system are monolithically integrated. As used herein, monolithic integration includes, but is not necessary limited to, two or more electronic devices that are manufactured on the same substrate (a common substrate) and used in an end application on the same common substrate. Monolithically integrated devices that are transferred to another substrate as a unit remain monolithically integrated. Exemplary electronic devices include LEDs, transistors, capacitors and the like.

Where portions of each of two or more elements are monolithically integrated, the two elements are considered to be monolithically integrated. For example, two luminescent elements are monolithically integrated if, for example, the electroluminescent devices in the two elements are monolithically integrated. This is so, even if, for example, the light converting element in each element is adhesively bonded to the corresponding electroluminescent device.

In cases where the electroluminescent devices include semiconductor layers, the electroluminescent devices are monolithically integrated if the devices are manufactured on the same substrate and/or if they include a common semiconductor layer. For example, where each electroluminescent device includes an n-type semiconductor layer, the devices are monolithically integrated if the n-type semiconductor layer extends across the electroluminescent devices. In such a case, the n-type semiconductor layers in the electroluminescent devices may form a continuous layer across the electroluminescent devices.

At least one luminescent element in light emitting system 100 includes one or more light converting elements for converting light emitted by the electroluminescent device(s) in the luminescent element. For example, luminescent element 110 includes light converting elements 140 and 141, and luminescent element 111 includes light converting element 142. In some cases a light converting element can be, or may include, a potential well or a quantum well.

As used herein, potential well means one or more semiconductor layers in a multilayer semiconductor structure designed to confine a carrier in one dimension only, where the semiconductor layer or layers have lower conduction band energy than surrounding layers and/or higher valence band energy than surrounding layers. The term "quantum well" generally refers to a potential well that is sufficiently thin that quantization effects increase the energy for electron-hole pair recombination in the well. A quantum well typically has a thickness of about 100 nm or less, and preferably about 10 nm or less. The term "quantum dot" refers to a potential well that confines a carrier in three dimensions, and is sufficiently small that quantization effects increase for electron-hole pair recombination within the dot. A quantum dot typically has a dimension of less than 100 nm and preferably about 10 nm or less.

In some embodiments, not all luminescent elements in the light emitting system 100 include a light converting element. For example, luminescent element 113 includes electroluminescent device 123 but does not include a light converting element. In such cases, the light output of the luminescent element and the electroluminescent device in the luminescent element have the same wavelength or spectrum.

In the context of a display system, a luminescent element can be a pixel or a sub-pixel in the light emitting system. The pixelated light emitting system can emit light at different wavelengths, for example, in the visible region of the spectrum. For example, the electroluminescent devices 120, 121, 123 in the light emitting system 100 may emit blue light. Light converting element 140 may include a blue-to-green light converting potential well absorbing the blue light emitted by the electroluminescent device 120 and emitting green light. Light converting element 141 can include a green-to-red light converting potential well absorbing the green light emitted by the light converting element 140 and emitting red light. Light converting element 142 may include a blue-to-green light converting potential well to absorb the blue light emitted by electroluminescent device 121 and thus emit green light. In such cases, elements 110, 111 and 113 output red, green and blue light respectively. In another embodiment, light converting elements 141 and 142 include a blue-to-green potential well while light converting element includes a blue-to-red light converting well. In this latter case, red light generated in light converting element 140 is simply transmitted through light converting element 141.

Light emitting system 100 may efficiently output light at any desirable wavelength in, for example, the visible region of the spectrum. For example, light emitting system 100 can efficiently emit green light since the blue emitting electroluminescent devices and blue-to-green light converting elements can be highly efficient. Improved efficiency can result in reduced power consumption in an optical system that incorporates a light emitting system similar to system 100.

Light emitting system 100 can be more compact than conventional light sources. Accordingly, optical systems utilizing light emitting system 100 can be more compact, for example thinner, and have reduced weight.

In some applications, such as in a projection system or a backlight system, light emitting system 100 may function as a light source for illuminating one or more image forming devices. The light emitting system can be designed to efficiently emit, for example, a primary color or white light. The improved efficiency and the compactness of light emitting system 100 allows for improved and/or novel system designs. For example, portable battery-powered optical systems can be designed with reduced size, power consumption and weight.

In some applications, such as in projection systems, light emitting system 100 can function as both a light source and an image forming device. In such applications, conventional image forming devices such as liquid crystal display panels (LCDs) or digital micro-mirror devices (DMDs) can be eliminated from the projection system. Conventional projection systems include one or more relay optical elements for transferring light from light sources to image forming devices. The relay optics can be eliminated in a projection system that incorporates light emitting image forming device 100, thereby reducing the number of elements, size, optical loss, power consumption, weight and overall cost.

In general, the array of luminescent devices in light emitting system 100 can be any type array desirable in an application. In some cases, the array can be a row or column, such as a 1×n array where n is an integer greater than or equal to two. In some cases, the array may be a two-dimensional array, for example a square (m×m) array or a rectangular array (m×n) array, where m and n are both integers greater than two. In some cases the array may be a trapezoidal array, a hexagonal array or any other type of array where the relative positions of the elements are regular or irregular.

In some cases the luminescent elements in the array (or pixels in the array in the context of a display system) can be of equal size, or of different sizes, for example to account for difference in the efficiency of generating different colors.

A luminescent element in an array of luminescent elements can have any shape, such as square, oval, rectangular or more complex shapes to accommodate, for example, optical and electrical functions of a device incorporating the array. The luminescent elements in an array can be placed in any arrangement that may be desirable in an application. For example, the elements can be uniformly spaced, perhaps in a rectangular or hexagonal arrangement. In some cases the elements may be placed non-uniformly, for example to improve device performance by reducing or correcting optical aberrations such as pincushion or barrel distortions.

An efficient, cost effective solid-state microemissive imager, on the order of one centimeter in size, such as may be used for microprojection applications, has pixels that are small (around 2 μm for a VGA resolution imager) and low aspect ratio to reduce optical cross-talk between adjacent pixels. No single solid-state material has been identified that can be used for direct efficient electroluminescent emission over the full visible spectrum (at least about 440 nm to about 640 nm for projection applications). The generally proposed approach is to absorb a portion of the light emitting by a short wavelength light emitting diode (LED) and to re-emit the energy at a longer wavelength in a spatially selective manner. Suitable down-conversion materials include semiconductor quantum wells, quantum dots and rate-earth phosphors. One challenge with quantum dots and phosphors is that the material extinction coefficient of these materials is relatively low, and thus a relatively thick conversion layer is required to absorb the short wavelength light. Increasing the concentration of the absorbing species (e.g. quantum dots or rare earth dopant ions) can reduce the thickness of the absorbing layer, but this is counter-balanced by self-quenching effects which can reduce the down-conversion efficiency.

Non-radiative pumping of fluorophores has been demonstrated as an alternative approach for down-conversion. In this case, dipole-dipole coupling between an emitting layer and a nearby fluorophore can lead to efficient Förster energy transfer (FRET) from one to the other without the optical inefficiencies associated with radiation and re-absorption. The rate of this non-radiative energy transfer scales as $d^{-4}$, where d is the separation distance between dipoles involved in the energy transfer. Accordingly, the fluorophore and the pump layer have to be very close, typically around 10 nm or less, for FRET to occur with reasonable efficiency.

Non-radiative pumping of a monolayer of CdS nanocrystals on top of an InGaN/GaN quantum well has been previously demonstrated but the challenge with this approach is that the LED layer (either p-layer or n-layer) that lies between the LED quantum well layer and the nanocrystals has to be less than about 10 nm thick in order to achieve the efficient transfer of energy. Such a thin LED layer, however, leads to poor current spreading and an inefficient pump source.

According to at least some of the embodiments of the present invention, the problem of the thin layer is avoided by allowing for radiative pumping of a secondary quantum well that lies outside the active region of the electroluminescent device, and then using FRET to pump a down-conversion material. In some embodiments, the down-conversion material may be patterned on the surface of the electroluminescent device. This allows the use of highly efficient electroluminescent devices with non-radiative down-conversion.

Figure 2A:
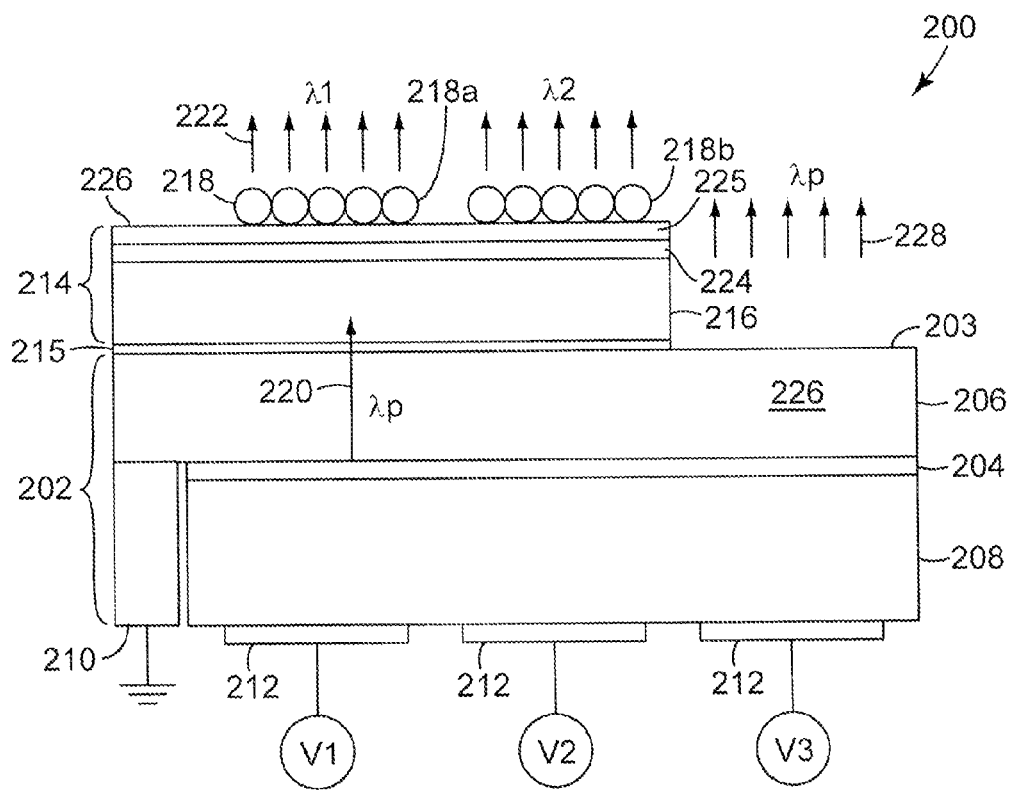
FIGS. 2A and 2B schematically illustrate embodiments of a light emitting system incorporating a wavelength converter that includes non-radiative energy transfer from an absorber to energize light emitting elements according to principles of the present invention.

An exemplary embodiment of a light emitting system 200 that uses non-radiative down-conversion is schematically illustrated in FIG. 2A. The system 200 includes an electroluminescent device 202. In some cases, the electroluminescent device 202 can include a phosphorescent material capable of emitting light when absorbing electrical energy. In some cases, electroluminescent device 202 can include a semiconductor electroluminescent device such as a light emitting diode (LED) or a laser diode. An electroluminescent device in light emitting system 200 can be any device capable of emitting light in response to an electrical signal.

For example, an electroluminescent device can be a light emitting diode (LED) capable of emitting photons in response to an electrical current as discussed in, for example, U.S. Patent Publication No. 2006/0124917, entitled "Adapting Short-Wavelength LED's for Polychromatic, Broadband, or 'White' Emission", incorporated herein by reference in its entirety. In some cases an LED can include one or more p-type and/or n-type semiconductor layers, one or more active layers that may include one or more potential and/or quantum wells, buffer layers, substrate layers, and superstrate layers.

In other embodiments, the electroluminescent device 202 may include a laser, for example a semiconductor layers such as a vertical cavity surface emitting laser (VCSEL), or the like.

In the illustrated embodiment, the electroluminescent device 202 is shown as an LED 203, which is schematically illustrated as having an active layer 204 disposed between a first doped layer 206 and a second doped layer 208. The first and second doped layers 206 and 208 are of opposite doping type, and so the first doped layer 206 may be n-doped while the second doped layer 208 is p-doped, or the first doped layer 206 may be p-doped while the second doped layer 208 is n-doped.

It will be appreciated that additional layers may be present in the electroluminescent device, for example for current or light control, in addition to those layers illustrated here. Such layers, including a semiconductor substrate, have been omitted for clarity.

In the illustrated embodiment the LED 203 is formed with electrodes all on the same side. A common electrode 210 is connected to the first doped layer 206 while one or more active electrodes 212 are connected to the second doped layer.

In some embodiments there are two or more active electrodes 212, which may be activated together or may be activated independently of each other. The area of the active layer 204 above a particular active electrode 212 emits light when that active electrode 212 is activated. Thus, when the different active electrodes 212 are activated independently of each other, the different areas of the active layer 204 above the respective active electrodes emit light independently of each other. For example, when a signal is applied to the active electrode 212 marked "V1", without signals being applied to the active electrodes 212 marked "V2" or "V3", then only that area of the active layer 204 that lies above electrode V1 emits light. Thus various areas of the electroluminescent device 202 can selectively be made to emit light or not emit light, thus creating a desired pattern of emitted light. The pattern may be a monochromatic pattern or, as is explained further below, may be a colored pattern.

It will be appreciated, of course, that the electroluminescent device 202 may have any desired number of active electrodes 212, depending on the desired application of the device. When the electroluminescent device 202 is provided with three or more active electrodes 212, the active electrodes 212 may be formed in a regular pattern, or an irregular pattern, across the area of the device 202. In those embodiments in which only a single active electrode is used, the active electrode may be coupled to either the first or second doped layer 206 or 208.

Figure 2B:
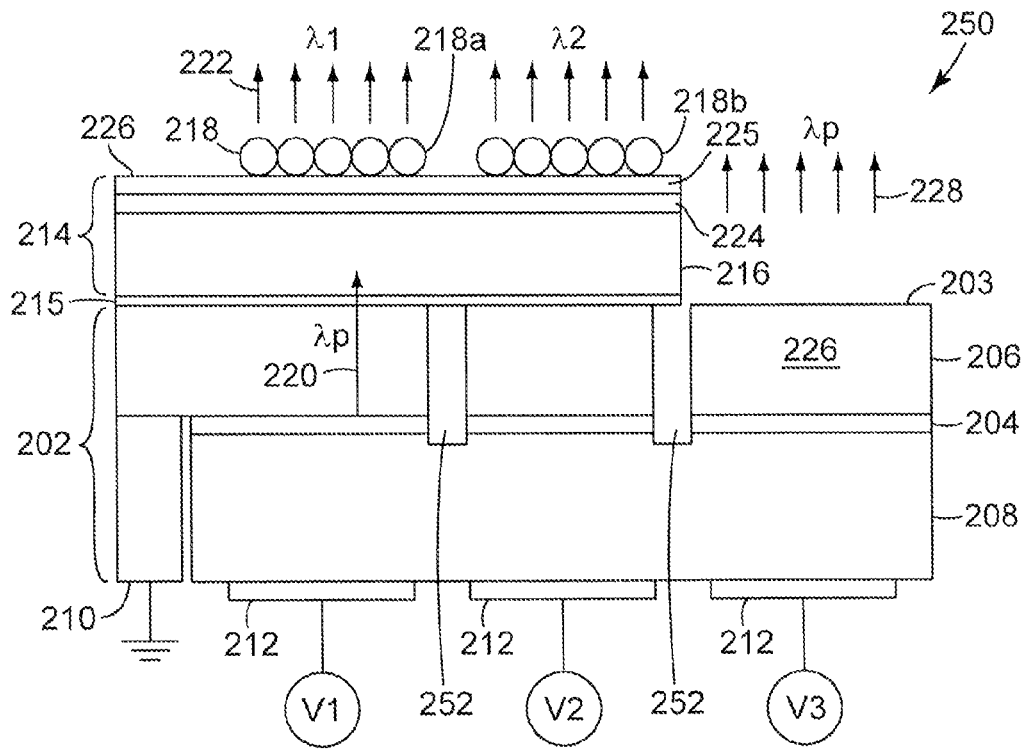

The different emitting regions in the electroluminescent device 202 may be electrically pixelated, as shown in FIG. 2A, or may be physically pixelated, with a region of air or other dielectric material between pixels. FIG. 2B schematically illustrates an embodiment of a system 250 similar to that shown in FIG. 2A, but with the addition of pixel boundaries 252 disposed between pixels. The pixel boundaries 252 are shown as etched areas that contain air. The pixel boundaries could, however, contain another dielectric material. It will be appreciated that the light emitting system 250 may only have one electrode below the second doped region 208, common to all pixels, with the only effective pixelation arising from the pixel boundaries. In other embodiments, two or more different pixels may share electrodes.

The active layer 204 is the layer in which the electroluminescent device 202 generates light. In both LEDs and lasers, the active layer is typically a diode junction, where carrier recombination produces light. Thus, the active layer 204 may be any type of layer known for generating light, for example a heterojunction layer, a quantum well layer, and the like.

A wavelength converter 214 is attached to the electroluminescent device 202. The wavelength converter 214 is able to generate light at least one wavelength, $\lambda 1$, different from the pump wavelength, $\lambda p$, generated by the electroluminescent device 202. The wavelength converter 214 includes an absorbing layer 216, preferably a quantum well 224, and light emitting elements 218. The light emitting elements 218 are small, preferably less than 1 µm in dimension, more preferably less than 100 nm. The light emitting elements 218 may be formed of various materials as is discussed below. The wavelength converter 218 may be attached directly to the electroluminescent device 202, for example through direct bonding, sometimes referred to as optical bonding, or may be attached using an optional adhesive layer 215. In other embodiments the absorbing layer 216 and the quantum well 224 may be grown directly on top of the electroluminescent device 202. In some embodiments, the first doped layer 206 of the electroluminescent device 202, lying between the active layer 204 and the wavelength converter 214, has a thickness of at least 20 nm, and in other embodiments a thickness of at least 50 nm.

The absorbing layer 216 is typically formed of a semiconductor material whose energy gap is selected so that the pump light 220 at $\lambda p$ is absorbed in the absorbing layer 216. The presence of electron/hole pairs close to the surface 226 of the absorbing layer 216 just below the light emitting element 218, permits dipole-dipole coupling to take place between the electron/hole pairs in the absorbing layer 216 and the light emitting elements 218. This coupling may lead to efficient Förster energy transfer, which results in non-radiative transfer of energy from the absorbing layer to the light emitting elements 218, which become excited. The excited light emitting elements 218 consequently emit light 222, for example at a wavelength, $\lambda 1$, which is typically longer than the pump wavelength, $\lambda p$. The strength of non-radiative coupling between the electron/hole pairs in the absorbing layer 216 and the light emitting elements 218 varies as $d^{-4}$, where d is the distance separating the light emitting element 218 from the electron/hole pair. One consequence of this strong inverse dependence on separation distance is that the amount of energy coupled non-radiatively to the light emitting elements 218 can be significantly increased if the electron-hole pairs in the absorbing layer 216 can be concentrated close to the light emitting elements 218.

In some embodiments, a quantum well 224 is disposed within the absorbing layer 216 close to the surface 226. The quantum well 226 traps carriers, resulting in an increase in the concentration of electrons and holes close to the surface 226, thus increasing the non-radiative coupling efficiency of energy from the absorbing layer 216 to the light emitting elements 218.

The absorbing layer 216 may be formed of a direct band gap semiconductor material, or may be formed of a semiconductor material having an indirect band gap. In the case of an indirect band gap material, it is preferred that the energy of the photon being absorbed is greater than the direct band gap of the indirect band gap material, in other words when no phonons are necessarily involved in the absorption of the photon.

Various different embodiments of light emitting elements 218 are contemplated. One type of light emitting element 218 is a semiconductor particle having two or more orthogonal dimensions less than 100 nm and preferably less than 10 nm. In some embodiments, the particle has three orthogonal dimensions of less than 100 nm, in which case the particle is termed a "quantum dot." In other embodiments, where only two orthogonal dimensions are less than 100 nm, the particle is termed a "quantum wire." A particle having at least two orthogonal dimensions less than 1000 nm is regarded as being a nanoparticle. The confinement from a quantum wire or quantum dot results in the production of a distinct set of energy levels. The wavelength at which the quantum wire or dot radiates is dependent in part on the type of semiconductor from which the quantum wire or dot is made, and in part on its size. Quantum wires or dots can be formed of any suitable type of semiconductor material, which is a design choice based on the wavelength range of the radiation that the quantum dot is designed to emit. While not intended to be limiting, some suitable types of semiconductor materials include Group IV elements such as Si or Ge; III-V compounds such as InAs, AlAs, GaAs, InP, AlP, GaP, InSb, AlSb, GaSb, GaN, AlN, InN and alloys of III-V compounds such as AlGaInP and AlGaInN; II-VI compounds such as ZnSe, CdSe, BeSe, MgSe, ZnTe, CdTe, BeTe, MgTe, ZnS, CdS, BeS, MgS and alloys of II-VI compounds, or alloys or other combinations of any of the compounds listed above.

Other types of light emitting elements 218 may be formed from nanoparticles of phosphor materials such as strontium thiogallates, doped GaN, copper-activated zinc sulfide, and silver-activated zinc sulfide. Other useful nanophosphor materials may include doped YAG, silicate, silicon oxynitrides, silicon nitride, and aluminate-based phosphors. Examples of such phosphors include Ce:YAG, SrSiON:Eu, SrSiN:Eu and BaSrSiN:Eu. Additionally, light emitting elements 218 may be formed thin films of light emitting molecules or light emitting polymers such as poly(p-phenylene vinylene), polyfluorene, polythiophenes, polypyridines, poly(pyridyl vinylenes (and copolymers of these materials. Useful small molecule emitters include laser dyes, tris(8-hydroxyquinolinate)aluminum (Alq3) and the like.

Figure 3:
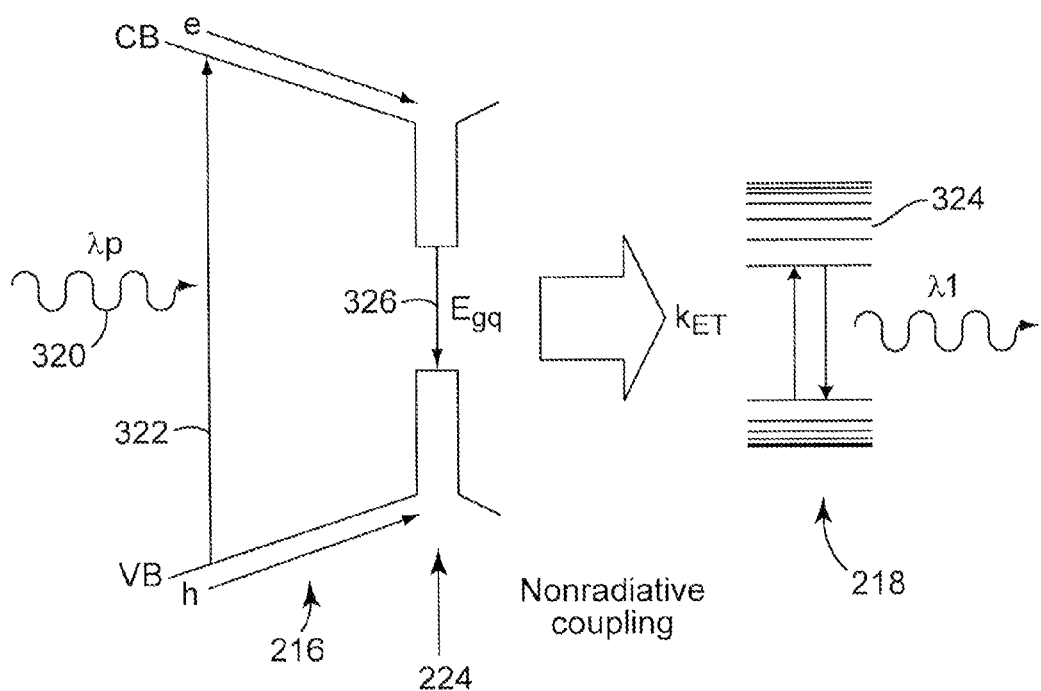
FIG. 3 schematically illustrates energy levels within different portions of the light emitting system schematically illustrated in FIG. 2.

An exemplary schematic energy level diagram, presented in FIG. 3, is useful in understanding the various processes involved in converting energy from the electroluminescent device 202 into light at another wavelength. At the left of the diagram is shown the energy gap between the valence band (VB) and the conduction band (CB) in the absorbing layer 216. An incoming photon 320 from the electroluminescent device 202, at a wavelength of $\lambda p$, is shown as being absorbed in the absorbing layer, which raises an electron from the valence band to the conduction band, leaving a hole in the valence band, as is illustrated by the vertical arrow 322.

The electrons and holes thus generated drift to the quantum well 224 where they become trapped. In some embodiments the size of the energy gap between the valence band and the conduction band is spatially independent within the absorbing layer 216. In other embodiments, for example as shown in the illustrated embodiment, the absorbing layer 216 may be graded so that the energy gap decreases with increasing penetration into the absorbing layer 216 from the electroluminescent device 202. This enhances the drift of the electrons and holes to the quantum well 224, thus increasing the population of electrons and holes in the quantum well 224. The absorbing layer 216 may be graded by changing its composition from one side to the other.

The light emitting element 218, shown at the right side of the figure, demonstrates an energy level structure 324 which, in the case of the light emitting element being a quantum dot, arises from the small dimensions of the quantum dot. For clarity, only a small number of the possible energy levels are illustrated. The light emitting element 218 has at least two energy levels separated by an energy difference, $E_1$, that corresponds to the converted wavelength, $\lambda 1$, i.e. $E_1 \sim hc/\lambda 1$, where h is Planck's constant and c is the speed of light.

When the electrons and holes collect in the quantum well 224, they are subject to the possibility of recombination in the quantum well 224 or non-radiative energy transfer to the light emitting element 218. This radiative or non-radiative recombination in the quantum well 224 is represented by the downward pointing arrow 326, and the non-radiative energy transfer has a coupling coefficient shown as $k_{et}$ in the figure.

The energy gap of the quantum well 224, $E_{gq}$, may be engineered to be to be substantially similar to the energy difference $E_1$, for example within about 25% of $E_1$. The coupling coefficient for non-radiative energy transfer, $k_{et}$, increases as $E_{gq}$ approaches the same value as $E_1$. The emission spectrum of the quantum well 224 preferably overlaps a strong absorption of the light emitting element 218 but does not necessarily coincide with the low energy absorption edge of light emitting element 218 that corresponds to a transition to the lowest excited state. Absorption in a quantum wire or dot generally increases with photon energies above the low energy absorption edge.

The cap layer 225, between the quantum well 224 and the light emitting elements 218 may be formed of the same material as the absorbing layer 216, or may be formed of a different material. For example, the cap layer 225 may include a material that has an energy gap larger than the energy gap of the absorbing layer 216.

Several different methods are available for applying the light emitting elements to the device. For example, colloidal light emitting elements may be patterned on the surface 226 of the light absorbing layer 216 using directed self-assembly, microcontact printing, nanoimprint lithography, conventional photolithography, Langmuir Blodgett monolayer deposition or other techniques. In one particular example of directed self-assembly, the absorbing layer may be patterned with bi-functional self-assembled monolayers that bind the desired type of quantum dot in the selected region.

Such techniques may also be used to selectively position different types of light emitting element in selected areas. For example, light emitting elements capable of emitting light at a first wavelength may be positioned in certain areas while light emitting elements capable of emitting light at a different wavelength are positioned in different areas. Such selectivity in manufacturing allows the device to independently control the emission of light of different colors from different areas of the device, i.e. the device has independently controllable pixels that emit light of different colors. In the embodiment illustrated in FIG. 2, a first set of light emitting elements 218a is positioned above active electrode V1 while a second set of light emitting elements 218b is positioned above active electrode V2. If the first and second sets of light emitting elements 218a and 218b emit light at different wavelengths, $\lambda 1$ and $\lambda 2$ respectively, then the active electrodes V1 and V2 can be used to independently control the emission of light at wavelengths $\lambda 1$ and $\lambda 2$. In the illustrated embodiment, the third active electrode V3 is used to activate a portion 226 of the electroluminescent device 202 above which there is no absorbing layer 216 or light emitting elements 218. Thus, the light 228 emitted from this region of the device 200 is at the pump wavelength $\lambda p$. It will be appreciated that the device 200 may stretch beyond the limits of the figure, and that additional regions, not shown, may produce light at $\lambda p$, $\lambda 1$ or $\lambda 2$. In some embodiments, $\lambda p$ is blue light while $\lambda 1$ and $\lambda 2$ are green and red respectively. Thus, the device 200 may be capable of producing the full color gamut needed for color imaging.

Figure 4:
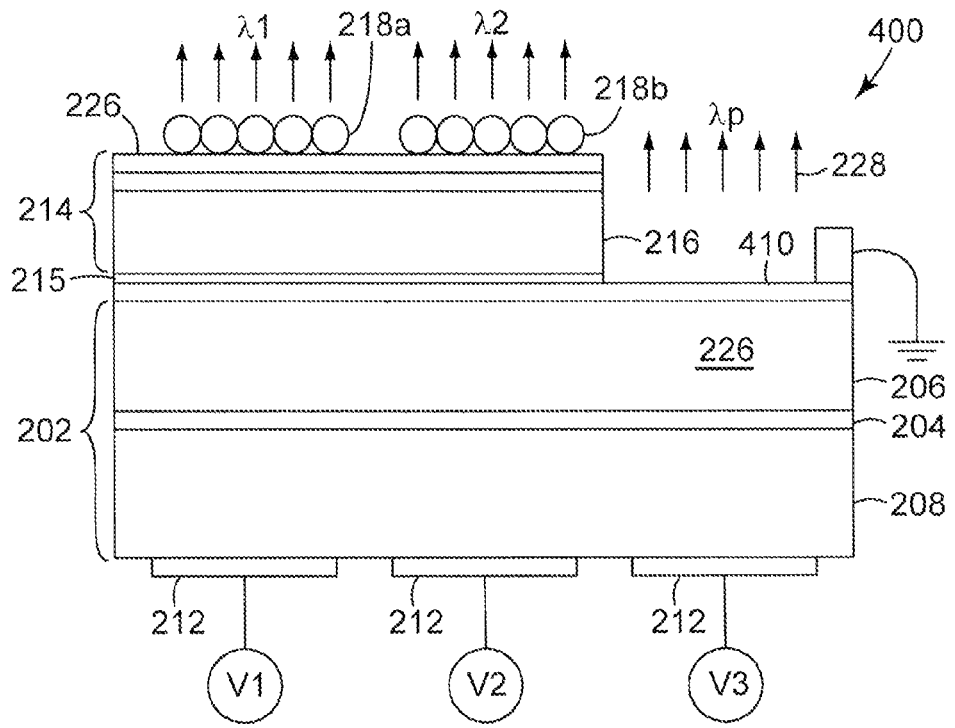
FIG. 4 schematically illustrates another embodiment of a light emitting system incorporating a wavelength converter that includes non-radiative energy transfer from an absorber to energize light emitting elements according to principles of the present invention.

Different configurations may be used for the common electrode. In the exemplary embodiment illustrated in FIG. 2, the common electrode 210 is disposed on the same side of the device 200 as the active electrodes 212. In another embodiment, schematically illustrated in FIG. 4, the device 400 has a common electrode 410 that is disposed between the electroluminescent device 202 and the wavelength converter 214. In this case, since the pump light 220 has to pass through the electrode 410 to reach the wavelength converter 214, the electrode 410 preferably is designed to reduce the reflection or absorption of light at $\lambda p$. For example, the electrode 410 may be formed of a transparent conductive material such as indium tin oxide (ITO) or the like. In other embodiments the electrode 410 may be formed as a grid, where the pump light 220 can pass through the apertures of the grid with relatively high transmission. In still other embodiments, the electrode 410 may be formed as a grid of transparent conductive material to further increase the transmission of pump light 220 to the wavelength converter 214.

Figure 5:
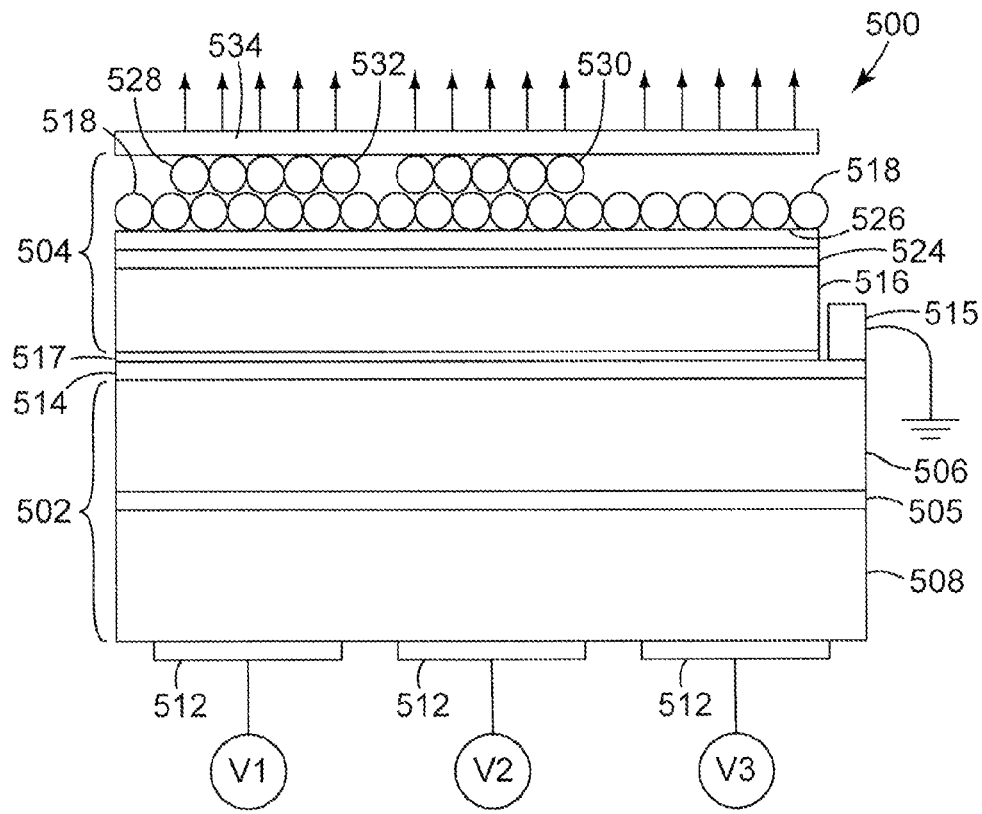
FIG. 5 schematically illustrates another embodiment of a light emitting system that uses a wavelength converter with two steps of non-radiative energy conversion according to principles of the present invention.

Another embodiment of a light emitting device 500 is schematically illustrated in FIG. 5. The device 500 includes an electroluminescent device 502 and a wavelength converter 504. The electroluminescent device 502 may be of any of the types of electroluminescent device discussed above. In the illustrated embodiment the electroluminescent device 502 is in the form of an LED, and has an active region 505 disposed between two doped layers 506 and 508. One side of the electroluminescent device 502 is provided with one or more electrodes 512 that are connected to the second doped layer 508, which may be independently addressable. Another electrode 514 is connected to the first doped layer 506 that lies between the active region 505 and the wavelength converter 504. The electrode 514 may be connected to at an upper side connecting element 515. In another embodiment, not illustrated, the electrode 514 connected to the first doped layer 506 may pass through a via in the second doped layer 508 for access on the same side as the electrodes 512, in a manner similar to that illustrated in FIG. 2. An optional bonding layer 517 may be employed to attach the wavelength converter 504 to the electroluminescent device 502. In other embodiments the wavelength converter 504 may be directly bonded to the electroluminescent device 502.

The wavelength converter 504 includes an absorber layer 516 that has a quantum well 524 close to its upper surface. A first layer of nanoparticles 518, i.e. particles having at least two dimensions less than 1 μm, is positioned close to the quantum well 524, for example on the upper surface 526 of the absorber layer 516 for non-radiative energy transfer from the quantum well 524, in the manner described above.

A second layer of nanoparticles 528 is positioned above the first layer of nanoparticles 518, sufficiently close that the first nanoparticles 518 can non-radiatively transfer energy to the second nanoparticles 528. Light 530 from the electroluminescent device 502 is absorbed in the wavelength converter 504 and the first layer of nanoparticles 518 is nonradiatively excited. Some of the first layer of nanoparticles 518 may emit light at a first converted wavelength $\lambda 1$. Some of the energy in the first layer of nanoparticles 518 may be non-radiatively transferred to the second layer of nanoparticles 528. Accordingly, at least some of the second layer of nanoparticles 528 may emit light at a second converted wavelength, $\lambda 2$, which is different from $\lambda 1$.

Figure 6:
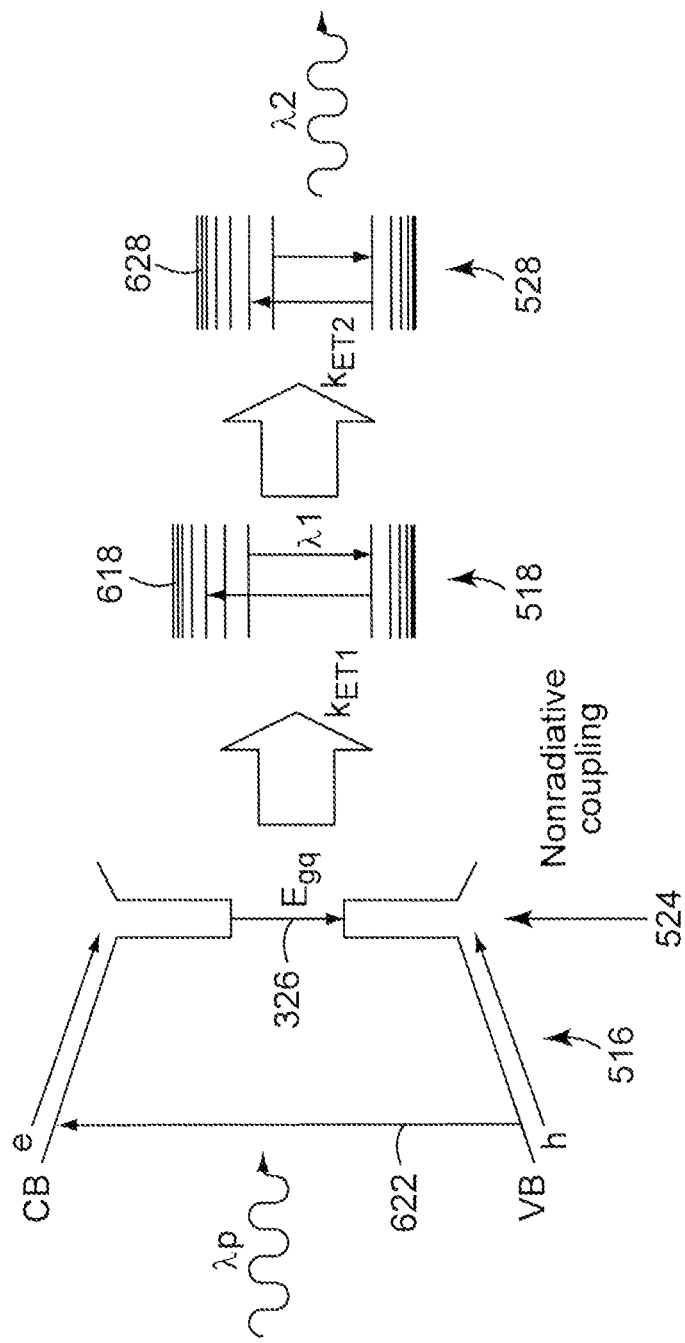
FIG. 6 schematically illustrates energy levels within different portions of the light emitting system schematically illustrated in FIG. 5.

A schematic energy level diagram is presented in FIG. 6 to illustrate energy transfer within the device 500. At the left of the diagram is shown the energy gap between the valence band (VB) and the conduction band (CB) in the absorbing layer 516. An incoming photon at λp from the electroluminescent device 502 is absorbed in the absorbing layer 516, which raises an electron from the valence band to the conduction band, leaving a hole in the valence band, as is illustrated by the vertical arrow 622.

The electrons and holes thus generated drift to the quantum well 524 where they become trapped. In some embodiments the size of the energy gap between the valence band and the conduction band may be spatially independent within the absorbing layer 516. In other embodiments, for example as shown in the illustrated embodiment, the absorbing layer 516 may be graded so that the energy gap decreases with increasing penetration into the absorbing layer 516 from the electroluminescent device 502. This enhances the drift of the electrons and holes to the quantum well 524, thus increasing the population of electrons and holes in the quantum well 524. The absorbing layer 516 may be graded by changing its composition from one side to the other.

The first light emitting element 518 demonstrates an energy level structure 618 which, in the case of the light emitting element being a quantum dot, arises from the small dimensions of the quantum dot. For clarity, only a small number of the possible energy levels are illustrated. The first light emitting element 518 has at least two energy levels separated by an energy difference, $E_1$, that corresponds to the first wavelength, λ1, i.e. $E_1 \sim hc/\lambda 1$, where h is Planck's constant and c is the speed of light. The wavelength λ1 is the wavelength of light that would be emitted by the first light emitting element 518 if not for non-radiative transfer of energy from the first light emitting element 518 to the second light emitting element 528.

The second light emitting element 528 demonstrates an energy level structure 628. For clarity, only a small number of the possible energy levels are illustrated. The second light emitting element 528 preferably has at least two energy levels that are separated by an energy corresponding to a photon having a wavelength of λ1 (at least to within 25% of such a photon energy), for efficient non-radiative transfer of energy from the first light emitting element 518 to the second light emitting element 528. The second light emitting element 528 subsequently emits a photon at λ2.

In some embodiments, the second layer of nanoparticles 528 may include only nanoparticles 530 that emit light at around λ2. In other embodiments, the second layer of nanoparticles may include some nanoparticles 530 that emit light at λ2, and also include nanoparticles 532 that emit light at some other wavelength, λ3.

By selective positioning of the different types of nanoparticles 530, 532 in the second layer of nanoparticles 528, or by omitting nanoparticles from certain regions altogether, the second layer of nanoparticles 528 may form a pixelated array of light emitting regions suitable for use as the imager in a projection system. In other embodiments, the wavelength converted may be used simply to produce light at different wavelengths, for example to produce light perceived as white light, from a single wavelength source.

In some embodiments, an optional filter 534 may be positioned over some or all of the electroluminescent device 502, to reduce the transmission of light at any unwanted wavelengths. For example, a portion of the light emitted by the electroluminescent device 502, at wavelength λp, may pass through the absorbing layer 516 of the wavelength converter 504. In such a case, it may be desired to remove the light at λp. For example by using a filter 534 to reduce the amount of light at λp that is emitted by the system 500. The filter 534 may operate in any suitable manner to achieve the reduction of light at specified wavelengths. For example, the filter 534 may differentially absorb light at different wavelengths or may differentially reflect light at different wavelengths.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices. For example, while the above description has discussed GaN-based LEDs, the invention is also applicable to LEDs fabricated using other III-V semiconductor materials, and also to LEDs that use II-VI semiconductor materials.

We claim:

1. A light source, comprising:
   an electroluminescent device capable of generating pump light;
   an absorbing element capable of absorbing at least some of the pump light; and
   a plurality of light emitting elements positioned proximate the absorbing element for non-radiative transfer of energy from the absorbing element to the light emitting elements, at least some of the light emitting elements being capable of emitting light having a wavelength longer than the wavelength of the pump light,
   wherein the absorbing element comprises a absorbing layer that absorbs at least some of the pump light, and wherein the absorbing layer is a semiconductor layer having an energy gap having a first value on a first side closer to the electroluminescent device and a second value on a second side closer to the light emitting elements, the first value being greater than the second value.

2. A light source as recited in claim 1, wherein the absorbing element further comprises a semiconductor quantum well proximate the second side of the absorbing layer.

3. A light emitting diode device, comprising
   a light emitting diode (LED) structure comprising an active semiconductor layer disposed between a first doped semiconductor layer and a second doped semiconductor layer, the active semiconductor layer capable of emitting pump light at a first wavelength;
   a plurality of light emitting elements arranged above the first doped semiconductor layer, the light emitting elements being capable of emitting light at a second wavelength longer than the first wavelength following non-radiative excitation; and
   an absorbing element disposed between the LED structure and the light emitting elements,
   wherein the first doped semiconductor layer has a thickness in excess of 20 nm, and wherein the absorbing element comprises an absorbing layer capable of absorbing at least some of the pump light emitted by the active layer, the absorbing layer further comprises a semiconductor quantum well proximate a first side of the absorbing layer, the first side of the absorbing layer facing the plurality of light emitting elements, and wherein the absorbing layer is a semiconductor layer having an energy gap having a first value on a first side closer to the first doped semiconductor layer and a second value on a second side closer to the light emitting elements, the first value being greater than the second value.

4. A light source, comprising:

an electroluminescent device capable of generating pump light at a pump wavelength;

an absorbing element capable of absorbing at least some of the pump light; and a plurality of first nanoparticles positioned proximate the absorbing element for non-radiative transfer of energy from the absorbing element to the first nanoparticles, and a plurality of second nanoparticles positioned proximate the first nanoparticles for non-radiative transfer of energy from the first nanoparticles to the second nanoparticles, at least some of the first nanoparticles having energy levels corresponding to a first wavelength longer than the pump wavelength and at least some of the second nanoparticles being capable of emitting light at a second wavelength longer than the first light wavelength, wherein the light emitting elements comprise nano-phosphor structures, and wherein at least some of the nanoparticles capable of emitting light at the second wavelength are arranged to form second wavelength pixels across at least some of the light source and at least some of the second nanoparticles capable of emitting light at the third wavelength are arranged to form third wavelength pixels across at least some of the light source, and wherein the absorbing layer is a semiconductor layer having an energy gap having a first value on a first side closer to the electroluminescent device and a second value on a second side closer to the first nanoparticles, the first value being greater than the second value.

* * * * *

UNITED STATES PATENT AND TRADEMARK OFFICE
CERTIFICATE OF CORRECTION

| | | |
|---|---|---|
| PATENT NO. | : 8,455,903 B2 | Page 1 of 1 |
| APPLICATION NO. | : 13/264817 | |
| DATED | : June 4, 2013 | |
| INVENTOR(S) | : Catherine A Leatherdale | |

It is certified that error appears in the above-identified patent and that said Letters Patent is hereby corrected as shown below:

Title Page,
Item [56] References Cited, OTHER PUBLICATIONS, delete "pixellated" and insert -- pixilated -- therefor.

In the Specification
Column 10,
Lines 36-37, delete "molecules" and insert -- moleculates -- therefor.
Lines 40-41, delete "hydroxyquinolinate" and insert -- hydroxyquinolinato -- therefor.

Signed and Sealed this
Eighth Day of October, 2013

Teresa Stanek Rea
*Deputy Director of the United States Patent and Trademark Office*